United States Patent
Wu et al.

(10) Patent No.: US 9,590,083 B2
(45) Date of Patent: Mar. 7, 2017

(54) ITC-IGBT AND MANUFACTURING METHOD THEREFOR

(71) Applicants: INSTITUTE OF MICROELECTRONICS, CHINESE ACADEMY OF SCIENCES, Beijing (CN); SHANGHAI LIANXING ELECTRONICS CO., LTD, Shanghai (CN); JIANGSU CAS-IGBT TECHNOLOGY CO., LTD, Jiangsu (CN)

(72) Inventors: Zhenxing Wu, Beijing (CN); Yangjun Zhu, Beijing (CN); Xiaoli Tian, Beijing (CN); Shuojin Lu, Beijing (CN)

(73) Assignees: INSTITUTE OF MICROELECTRONICS, CHINESE ACADEMY OF SCIENCES, Beijing (CN); SHANGHAI LIANXING ELECTRONICS CO., LTD, Shanghai (CN); JIANGSU CAS-IGBT TECHNOLOGY CO., LTD, Jiangsu (CN)

( * ) Notice: Subject to any disclaimer, the term of this patent is extended or adjusted under 35 U.S.C. 154(b) by 0 days.

(21) Appl. No.: 14/648,698

(22) PCT Filed: Dec. 6, 2012

(86) PCT No.: PCT/CN2012/086001
§ 371 (c)(1),
(2) Date: May 30, 2015

(87) PCT Pub. No.: WO2014/086014
PCT Pub. Date: Jun. 12, 2014

(65) Prior Publication Data
US 2015/0311327 A1     Oct. 29, 2015

(51) Int. Cl.
*H01L 29/66*     (2006.01)
*H01L 29/739*    (2006.01)
(Continued)

(52) U.S. Cl.
CPC ...... *H01L 29/7397* (2013.01); *H01L 21/2652* (2013.01); *H01L 21/30625* (2013.01);
(Continued)

(58) Field of Classification Search
None
See application file for complete search history.

(56) References Cited

U.S. PATENT DOCUMENTS 4,771,013 A * 9/1988 Curran ............... H01L 21/8221
148/DIG. 11
5,565,690 A * 10/1996 Theodore .......... H01L 21/26513
257/18
(Continued)

FOREIGN PATENT DOCUMENTS

CN      101009323 A  *  8/2007   ........... H01L 29/739
CN      101009323 A     8/2007
(Continued)

OTHER PUBLICATIONS

Temkin et al., GexSi1-x strained-layer heterostructure bipolar transistors, Applied Physics Letters 52, 1089 (1988), pp. 1089-1091.*
(Continued)

*Primary Examiner* — Johannes P Mondt
(74) *Attorney, Agent, or Firm* — Goodwin Procter LLP

(57) ABSTRACT

An ITC-IGBT and a manufacturing method therefor. The method comprises: providing a heavily doped substrate, forming a $Ge_xSi_{1-x}$/Si multi-quantum well strained super lattice layer on the surface of the heavily doped substrate, and forming a lightly doped layer on the surface of the $Ge_xSi_{1-x}$/Si multi-quantum well strained super lattice layer. The $Ge_xSi_{1-x}$/Si multi-quantum well strained super lattice layer is formed on the surface of the heavily doped substrate through one step, simplifying the production process of the ITC-IGBT.

15 Claims, 4 Drawing Sheets

(51) Int. Cl.
  *H01L 29/15* (2006.01)
  *H01L 21/265* (2006.01)
  *H01L 21/306* (2006.01)
  *H01L 21/324* (2006.01)
  *H01L 29/08* (2006.01)
  *H01L 29/36* (2006.01)
  *H01L 21/02* (2006.01)

(52) U.S. Cl.
  CPC ........ *H01L 21/324* (2013.01); *H01L 29/0817* (2013.01); *H01L 29/0821* (2013.01); *H01L 29/155* (2013.01); *H01L 29/36* (2013.01); *H01L 29/66348* (2013.01); *H01L 21/0245* (2013.01); *H01L 21/02507* (2013.01); *H01L 21/02532* (2013.01)

(56) References Cited

U.S. PATENT DOCUMENTS

| | | | | |
|---|---|---|---|---|
| 6,525,373 | B1* | 2/2003 | Kim | H01L 29/7813 257/328 |
| 2003/0161197 | A1* | 8/2003 | Iwata | G11C 11/16 365/200 |
| 2011/0101416 | A1* | 5/2011 | Schulze | H01L 29/0834 257/139 |
| 2011/0168226 | A1* | 7/2011 | Kim | H01L 31/035281 136/244 |
| 2011/0309647 | A1* | 12/2011 | Yang | H01L 21/67346 294/188 |

FOREIGN PATENT DOCUMENTS

| | | |
|---|---|---|
| CN | 101436541 A | 5/2009 |
| CN | 101436542 A | 5/2009 |
| CN | 101494238 A | 7/2009 |
| CN | 101499422 A | 8/2009 |
| WO | 2012056536 A1 | 5/2012 |

OTHER PUBLICATIONS

Bean et al, "GexSi1-x / Si strained-layer superlattice grown by molecular beam epitaxy", Journal of Vacuum Science and Technology A2 issue 2 Apr.-Jun. 1984, pp. 436-440.*
Computerized translation from google-patents of the text (only) of CN-101009323 A.*
International Search Report in PCT/CN2012/086001 mailed Sep. 19, 2013.

* cited by examiner

ITC-IGBT AND MANUFACTURING METHOD THEREFOR

CROSS-REFERENCE TO RELATED APPLICATION(S)

This application is a National Stage application of, and claims priority to, PCT International Application No. PCT/CN2012/086001, filed on Dec. 6, 2012, which is incorporated herein by reference in its entirety.

TECHNICAL FIELD

The present disclosure relates to the technical field of semiconductor fabrication, and in particular to an ITC-IGBT and a method for fabricating the ITC-IGBT.

BACKGROUND

An Internally Transparent Collector-Insulated Gate Bipolar Transistor (abbreviated as ITC-IGBT) is evolved from a conventional punch-through IGBT. As shown in FIG. 1, a high recombination layer 2 with defect centers and recombination centers in high concentration is introduced around a collector junction in a collector region 1, and the carriers in the high recombination layer 2 have sharply reduced lifetime, thus the collector region 1 at the rear side has a reduced injection efficiency, thereby causing a low concentration of carriers in a drift region 3. When the IGBT is turned off, the carriers in the drift region 3 are extracted by an electric field quickly, thereby improving the operating frequency of the IGBT.

In the conventional technology, generally Helium ion implantation or proton radiation is used to obtain a high recombination layer. However, by means of the Helium ion implantation or proton radiation, atoms (or ions) can not be implanted to a sufficient depth, and the obtained high recombination layer is thin.

In order to solve the above problems, it is proposed that a silicon-silicon bonding technology is used to obtain a high recombination layer. That is, impurities for the high recombination layer are implanted into an substrate, and Helium ions are implanted into the substrate to form the high recombination layer, then the high recombination layer bonds with another substrate, finally a front structure and a rear structure of the IGBT are formed by means of a process of fabricating the punch-through IGBT, and thus the ITC-IGBT is prepared. However, the process is complex.

SUMMARY

In order to solve the above technical problems, an ITC-IGBT and a method for fabricating the ITC-IGBT are provided according to embodiments of the disclosure, to reduce the difficulty of fabrication process.

A method for fabricating an ITC-IGBT is provided, which includes:

preparing a heavily doped substrate;

forming a $Ge_xSi_{1-x}/Si$ multiple quantum well strained superlattice layer on a surface of the heavily doped substrate by means of the molecular beam epitaxy process; and forming a lightly doped layer on a surface of the $Ge_xSi_{1-x}/Si$ multiple quantum well strained superlattice layer.

Preferably, after the process of forming a $Ge_xSi_{1-x}/Si$ multiple quantum well strained superlattice layer, the method further includes:

annealing the $Ge_xSi_{1-x}/Si$ multiple quantum well strained superlattice layer by means of the high temperature annealing process.

Preferably, the annealing temperature for the high temperature annealing process ranges from 700 Celsius degrees to 800 Celsius degrees.

Preferably, the $Ge_xSi_{1-x}/Si$ multiple quantum well strained superlattice layer has a thickness of 5 μm to 10 μm.

Preferably, the $Ge_xSi_{1-x}/Si$ multiple quantum well strained superlattice layer includes 50 cycles to 100 cycles of $Ge_xSi_{1-x}/Si$ strained superlattice layers.

Preferably, the $Ge_xSi_{1-x}/Si$ multiple quantum well strained superlattice layer is N-type doped, with a doping concentration ranging from $1e13$ $cm^{-3}$ to $5e13$ $cm^{-3}$.

Preferably, after the process of forming a lightly doped layer, the method further includes:

forming a front structure of the ITC-IGBT on the lightly doped layer; and forming a rear structure of the ITC-IGBT on a rear surface of the highly doped substrate.

Preferably, the process of forming a front structure of the ITC-IGBT on the lightly doped layer includes:

forming a trench in a surface of the lightly doped layer by means of the laser etching process;

forming a first gate dielectric layer on a bottom and sidewalls of the trench;

forming a trench gate in the trench, where the trench gate fills up the trench;

forming a second gate dielectric layer on a surface of the trench gate;

forming a well region in the surface of the lightly doped layer by means of the ion implantation process and the high temperature annealing process, where a surface of the well region is flush with the surface of the lightly doped layer;

forming an emitter region in the well region by means of the ion implantation process and the high temperature annealing process, where a surface of the emitter region is flush with the surface of the lightly doped layer; and forming an emitter on the surface of the well region and the surface of the emitter region and forming a gate on the surface of the trench gate by etching the second gate dielectric layer.

Preferably, the process of forming a rear structure of the ITC-IGBT on a rear surface of the highly doped substrate includes:

thinning the highly doped substrate by means of the chemical-mechanical polish process to form a collector region;

forming a collector on a rear surface of the collector region.

Preferably, the highly doped substrate is highly P-type doped, the lightly doped layer is lightly N-type doped, the well region is P-type doped and the emitter region is highly N-type doped.

An ITC-IGBT is provided, which includes:

a collector region;

a $Ge_xSi_{1-x}/Si$ multiple quantum well strained superlattice layer located on a surface of the collector region; and a lightly doped layer located on a surface of the $Ge_xSi_{1-x}/Si$ multiple quantum well strained superlattice layer.

Preferably, the $Ge_xSi_{1-x}/Si$ multiple quantum well strained superlattice layer has a thickness of 5 μm to 10 μm.

Preferably, the $Ge_xSi_{1-x}/Si$ multiple quantum well strained superlattice layer includes 50 cycles to 100 cycles of $Ge_xSi_{1-x}/Si$ strained superlattice layers.

Preferably, the $Ge_xSi_{1-x}/Si$ multiple quantum well strained superlattice layer is N-type doped, with a doping concentration ranging from 1e13 $cm^{-3}$ to 5e13 $cm^{-3}$.

Preferably, the ITC-IGBT further includes:

a front structure of the ITC-IGBT located on the lightly doped layer; and a collector located on a rear surface of the collector region.

Preferably, the front structure of the ITC-IGBT includes:

a trench located in a surface of the lightly doped layer;

a first gate dielectric layer located on a bottom and sidewalls of the trench;

a trench gate located in the trench, where the trench gate fills up the trench;

a second gate dielectric layer wrapping a surface of the trench gate;

a well region located in the surface of the lightly doped layer, where a surface of the well region is flush with the surface of the lightly doped layer;

an emitter region located in the well region, where a surface of the emitter region is flush with the surface of the lightly doped layer; and an emitter located on the surface of the well region and the surface of the emitter region and a gate located on the surface of the trench gate.

Preferably, the collector region is highly P-type doped, the lightly doped layer is lightly N-type doped, the well region is P-type doped and the emitter region is highly N-type doped.

Compared with the conventional technology, the above technical solutions have at least the following advantages.

In the technical solutions according to the embodiments of the disclosure, a heavily doped substrate is prepared, a $Ge_xSi_{1-x}/Si$ multiple quantum well strained superlattice layer is formed on a surface of the heavily doped substrate, and a lightly doped layer is formed on a surface of the $Ge_xSi_{1-x}/Si$ multiple quantum well strained superlattice layer. The $Ge_xSi_{1-x}/Si$ multiple quantum well strained superlattice layer is a metastable structure, and some dislocation defects are formed inevitably at the interfaces of $Ge_xSi_{1-x}/Si$. These dislocation defects and lattice mismatch may bring deep centers in a forbidden band, and become effective carrier traps or recombination centers. That is, the $Ge_xSi_{1-x}/Si$ multiple quantum well strained superlattice layer is a high recombination layer and is formed on the surface of the heavily doped substrate. Therefore, the $Ge_xSi_{1-x}/Si$ multiple quantum well strained superlattice layer may be formed with a large thickness, and formed on the surface of the heavily doped substrate in one step, thereby simplifying the fabrication process of the ITC-IGBT compared with the conventional technology.

DETAILED DESCRIPTION

As described in BACKGROUND, the conventional process for fabricating an ITC-IGBT is complex, and the inventor has found through research that a $Ge_xSi_{1-x}/Si$ multiple quantum well strained superlattice layer may be used as a high recombination layer in the ITC-IGBT.

On the basis of the above research, a method for fabricating an ITC-IGBT is provided according to embodiments of the disclosure. The method includes the following steps: preparing a heavily doped substrate; forming a $Ge_xSi_{1-x}/Si$ multiple quantum well strained superlattice layer on a surface of the heavily doped substrate; and forming a lightly doped layer on a surface of the $Ge_xSi_{1-x}/Si$ multiple quantum well strained superlattice layer.

In the technical solutions according to the embodiments of the disclosure, the $Ge_xSi_{1-x}/Si$ multiple quantum well strained superlattice layer may be formed with a large thickness, and formed on the surface of the heavily doped substrate in one step, thereby simplifying the fabrication process of the ITC-IGBT compared with the conventional technology.

To make the above objects, features and advantages of the disclosure more apparent and easy to be understood, specific embodiments of the disclosure are illustrated in details in conjunction with the drawings in the following.

First Embodiment

Figure 1:
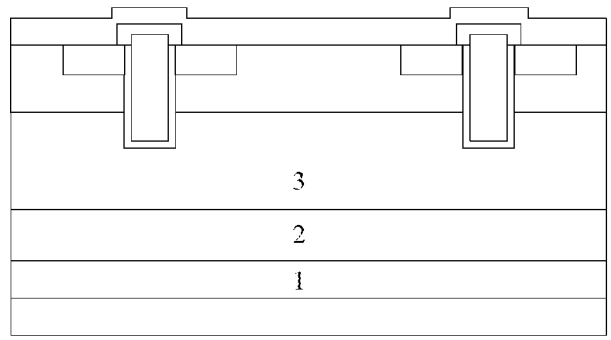
FIG. 1 is a schematic structural diagram of an existing ITC-IGBT.
Figure 2:
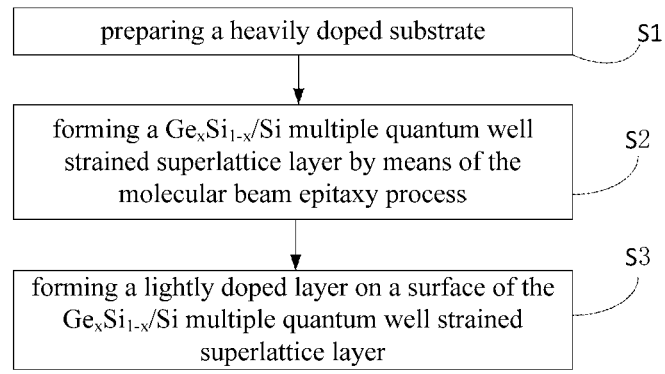
FIG. 2 is a flowchart of fabricating an ITC-IGBT according to an embodiment of the disclosure.

A method for fabricating an ITC-IGBT is disclosed according to the embodiment. As shown in FIG. 2, the method includes steps S1 to S3.

In step S1, a heavily doped substrate is prepared, and the heavily doped substrate is preferably a silicon substrate.

In step S2, a $Ge_xSi_{1-x}/Si$ multiple quantum well strained superlattice layer is formed on a surface of the heavily doped substrate by means of the molecular beam epitaxy process.

In step S3, a lightly doped layer is formed on a surface of the $Ge_xSi_{1-x}/Si$ multiple quantum well strained superlattice layer.

In the $Ge_xSi_{1-x}/Si$ strained superlattice structure, there is 4.2% lattice mismatch between Si and Ge, and within a critical thickness, a unified equilibrium lattice constant for Si and Ge along the interface may be achieved by elastic deformation, thereby forming the strained-layer superlattice with dislocation defects in low density. An elastic stress is generated due to lattice distortion, thus the superlattice is a metastable structure, and some dislocation defects are formed inevitably at the interfaces of $Ge_xSi_{1-x}/Si$. These dislocation defects and lattice mismatch may bring deep centers in a forbidden band and become effective carrier traps or recombination centers. That is, the $Ge_xSi_{1-x}/Si$ multiple quantum well strained superlattice layer is a high recombination layer and is formed on the surface of the heavily doped substrate. Therefore, the $Ge_xSi_{1-x}/Si$ multiple quantum well strained superlattice layer may be formed with a large thickness, and formed on the surface of the heavily doped substrate in one step, thereby simplifying the fabrication process of the ITC-IGBT compared with the conventional technology.

Second Embodiment

Another method for fabricating an ITC-IGBT is provided according to the embodiment. The ITC-IGBT with a trench gate as a front structure is taken as an example, and the method includes steps S11 to S16.

In step S11, a heavily doped substrate 10 is prepared, and the heavily doped substrate 10 is heavily P-type doped, with a thickness ranging from 300 μm to 500 μm.

In step S12, a $Ge_xSi_{1-x}/Si$ multiple quantum well strained superlattice layer is formed on a surface of the heavily doped substrate by means of the molecular beam epitaxy process.

Figure 3:
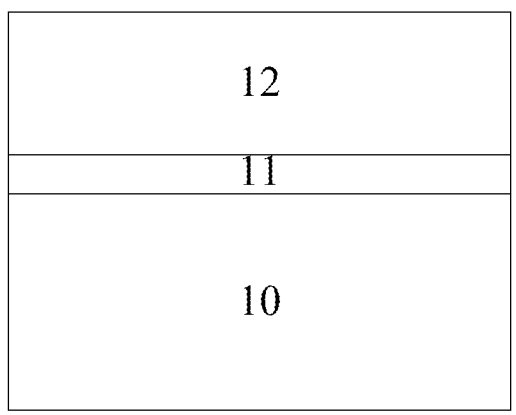
FIG. 3-FIG. 12 are schematic diagrams showing steps for fabricating an ITC-IGBT according to another embodiment of the disclosure.

As shown in FIG. 3, a $Ge_xSi_{1-x}$ layer with a thickness of 20 nm and a Si layer with a thickness of 80 nm grow alternately in 50 cycles to 100 cycles on the surface of the heavily doped substrate 10 by means of the molecular beam epitaxy process, to form the Ge$_x$Si$_{1-x}$/Si multiple quantum well strained superlattice layer 11 (that is, the Ge$_x$Si$_{1-x}$/Si multiple quantum well strained superlattice layer 11 includes 50 to 100 quantum wells). The Ge$_x$Si$_{1-x}$/Si multiple quantum well strained superlattice layer 11 has a thickness of 5 μm to 10 μm, preferably 8 μm. In the Ge$_x$Si$_{1-x}$/Si multiple quantum well strained superlattice layer 11, a deep energy level center E1 is located at Ec-0.28 eV, a deep energy level center E2 is located at Ec-0.3 eV and a deep energy level center E3 is located at Ec-0.22 eV. The Ge$_x$Si$_{1-x}$/Si multiple quantum well strained superlattice layer 11 is N-type doped, with a doping concentration ranging from 1e 13 cm$^{-3}$ to 5 e 13 cm$^{-3}$ preferably 2e 13 cm$^{-3}$ to 4e 13 cm$^{-3}$.

In step S13, the Ge$_x$Si$_{1-x}$/Si multiple quantum well strained superlattice layer is annealed by means of the high temperature annealing process. The annealing temperature for the high temperature annealing process ranges from 700 Celsius degrees to 800 Celsius degrees, preferably 750 Celsius degrees.

Since the Ge$_x$Si$_{1-x}$/Si multiple quantum well strained superlattice layer 11 is a metastable structure, some dislocation defects are formed inevitably at the interfaces of Ge$_x$Si$_{1-x}$/Si. After being annealed, the dislocation defects in the Ge$_x$Si$_{1-x}$/Si multiple quantum well strained superlattice layer 11 may form recombination centers at deep energy levels. That is, the Ge$_x$Si$_{1-x}$/Si multiple quantum well strained superlattice layer 11 becomes a high recombination layer, and is formed on the surface of the heavily doped substrate 10 by means of the molecular beam epitaxy process. Therefore, the Ge$_x$Si$_{1-x}$/Si multiple quantum well strained superlattice layer 11 may be formed with a large thickness, and formed on the surface of the heavily doped substrate 10 in one step, thereby simplifying the fabrication process of the ITC-IGBT compared with the conventional technology.

Additionally, the Ge$_x$Si$_{1-x}$/Si multiple quantum well strained superlattice layer 11 has temperature stability, and the dislocation defects are not decreased or dismissed with long term operation of the Ge$_x$Si$_{1-x}$/Si multiple quantum well strained superlattice layer 11 at a high temperature. Therefore, the dislocation defects in the Ge$_x$Si$_{1-x}$/Si multiple quantum well strained superlattice layer 11 according to the embodiment has better temperature stability compared with the high recombination layer obtained by means of ion implantation process.

In step S14, as shown in FIG. 3, a lightly doped layer 12 is grown on a surface of the Ge$_x$Si$_{1-x}$/Si multiple quantum well strained superlattice layer 11 by means of the epitaxy process, the lightly doped layer 12 is preferably a lightly N-type doped crystalline silicon layer, and the thickness of the lightly doped layer 12 may be determined according to the withstand voltage demands in device design and the capacity of an epitaxy apparatus, preferably, the lightly doped layer 12 has a thickness of 50 μm to 100 μm, or more preferably, the lightly doped layer 12 has a thickness of 70 μm to 80 μm.

After the lightly doped layer 12 is formed, the method further includes step 15.

In step 15, a front structure of the ITC-IGBT is formed on the lightly doped layer 12. The process of forming the front structure of the ITC-IGBT on the lightly doped layer 12 includes steps S151 to S156.

Figure 4:
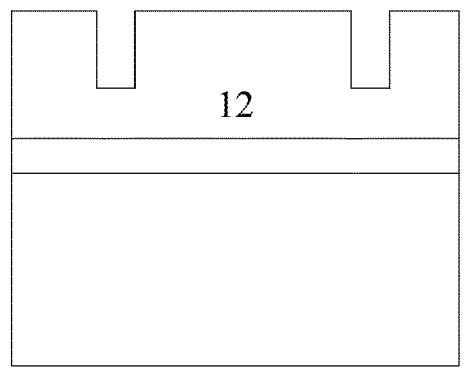

In step 151, as shown in FIG. 4, a trench is formed in the lightly doped layer 12. Specifically, a trench may be etched in the lightly doped layer 12 by using a mask having a trench pattern by means of the laser etching process, and the trench has a depth of 5 μm to 8 μm.

In step 152, a first gate dielectric layer is formed on a bottom and sidewalls of the trench by means of the thermal oxide process, and the first gate dielectric layer is made of silicon oxide. The first gate dielectric layer has a thickness of 800 nm to 1000 nm, preferably 900 nm.

A trench gate is formed in the trench, and the trench gate fills up the trench.

Figure 5:
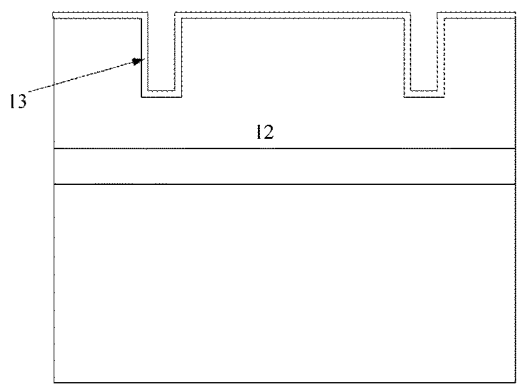
Figure 6:
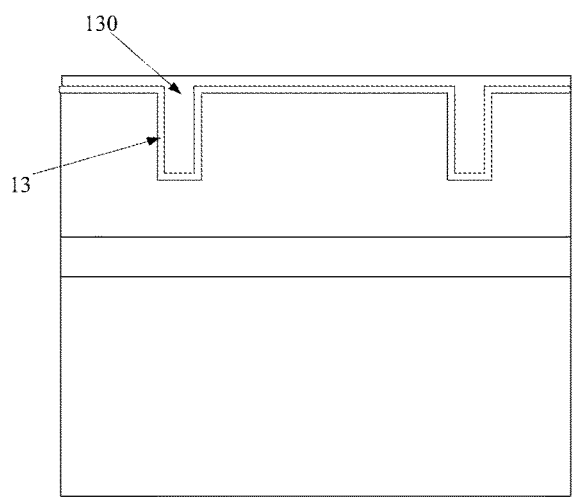
Figure 7:
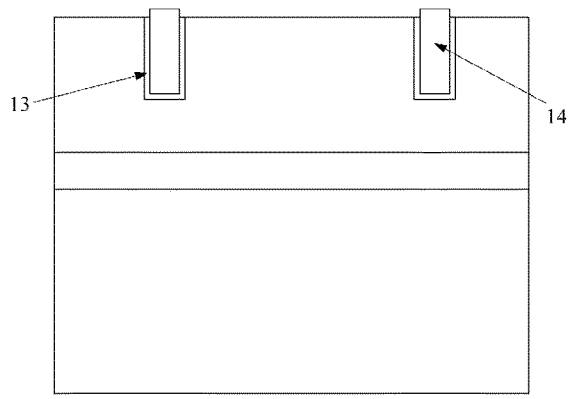

As shown in FIG. 5, after the first gate dielectric layer 13 is formed by means of the thermal oxide process, the first gate dielectric layer 13 covers a surface of the lightly doped layer 12. As shown in FIG. 6, a polysilicon layer 130 is deposited on a surface of the first gate dielectric layer 13 by means of the chemical vapor deposition process, and the polysilicon fills up the trench. In this case, the polysilicon layer 130 not only fills up the trench, but also exists beyond the trench. As shown in FIG. 7, by using a mask having a trench gate pattern, the portion of the polysilicon layer and the portion of the first gate dielectric layer which are not masked by the trench gate pattern are removed by means of the photoetching process and the etching process, to form a trench gate 14.

Figure 8:
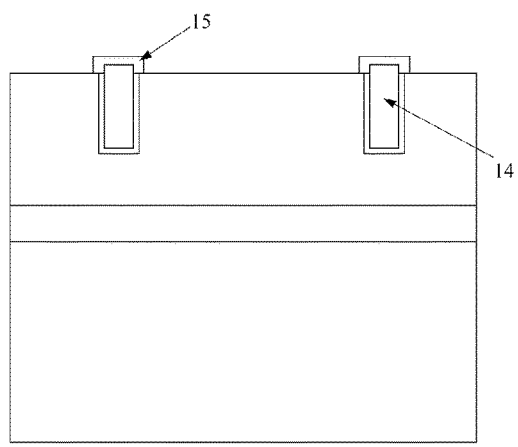

In step 153, as shown in FIG. 8, a second gate dielectric layer 15 is formed on a surface of on the trench gate 14, the second gate dielectric layer 15 wraps the surface of the trench gate 14, and the fabrication process of the second gate dielectric layer 15 is similar to that of the first gate dielectric layer, and is omitted herein.

Figure 9:
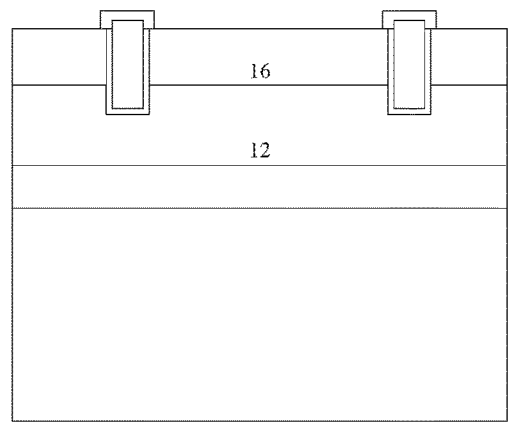

In step 154, as shown in FIG. 9, a well region 16 is formed in the surface of the lightly doped layer 12 by means of the ion implantation process and the high temperature annealing process, and a surface of the well region 16 is flush with the surface of the lightly doped layer 12. Specifically, doping ions are implanted into the surface of the lightly doped layer 12 by means of the ion implantation process, the doping ions are preferably Boron ions and the well region 16 is P-type doped. The doping ions in the well region 16 are activated by means of the high temperature annealing process, the annealing temperature for the high temperature annealing process ranges from 1150 Celsius degrees to 1200 Celsius degrees, and the annealing lasts for 1 h to 2 h.

Figure 10:
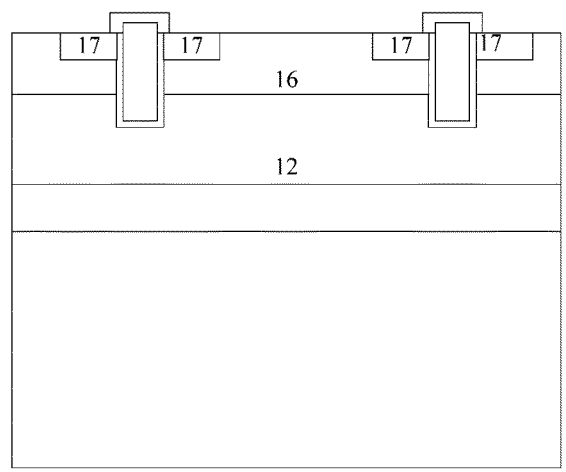

In step 155, as shown in FIG. 10, an emitter region 17 is formed in the well region 16 by means of the ion implantation process and the high temperature annealing process, and a surface of the emitter region 17 is flush with the surface of the lightly doped layer 12. Specifically, photoresist is coated on the surface of the lightly doped layer 12 to form a photoresist layer. The photoresist layer is exposed and developed by using a mask having an emitter region pattern. The emitter region pattern is formed on the photoresist layer, and then doping ions are implanted into the well region 16 by using the photoresist layer as a mask by means of the ion implantation process, to form the emitter region 17. The emitter region 17 is heavily N-type doped, with a doping concentration ranging from 1e$^{14}$ cm$^{-3}$ to 1e$^{16}$ cm$^{-3}$, and the doping ions in the emitter region 17 are preferably Arsenic ions or phosphorus ions. A high temperature annealing treatment is performed on the emitter region 17, with an annealing temperature ranging from 800 Celsius degrees to 950 Celsius degrees, to activate the doping ions in the emitter region 17. Finally, the photoresist layer is removed. The portion of the lightly doped layer 12 other than the emitter region 17 and the well region 16 is a drift region.

Figure 11:
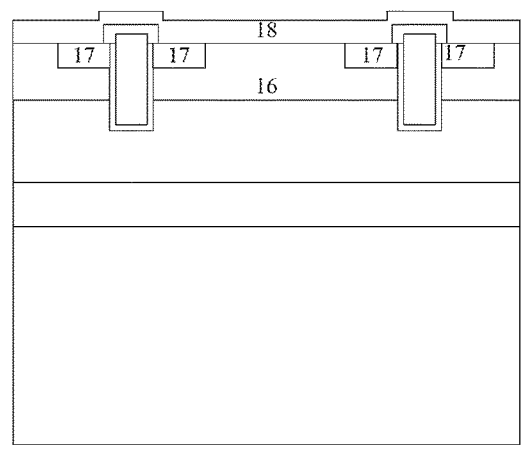

In step 156, as shown in FIG. 11, the second gate dielectric layer is etched to expose the trench gate 14, an emitter 18 is formed on the surface of the well region 16 and the surface of the emitter region 17, and a gate (not shown in FIG. 11) is formed on the surface of the trench gate 14. The emitter 18 is electrically contacted with the well region 16 and the emitter region 17, and the gate is electrically contacted with the trench gate 14.

After step 156, the process of forming the front structure of the ITC-IGBT on the lightly doped layer 12 further includes:

forming a passivation layer on surfaces of the emitter and the gate to prevent surface metal from being oxidized and prevent carriers being contaminated. The passivation layer is preferably a silicon nitride layer.

The passivation layer is etched to expose the gate and the emitter, to facilitate lead bonding, and thus the front structure of the ITC-IGBT is fabricated.

Figure 12:
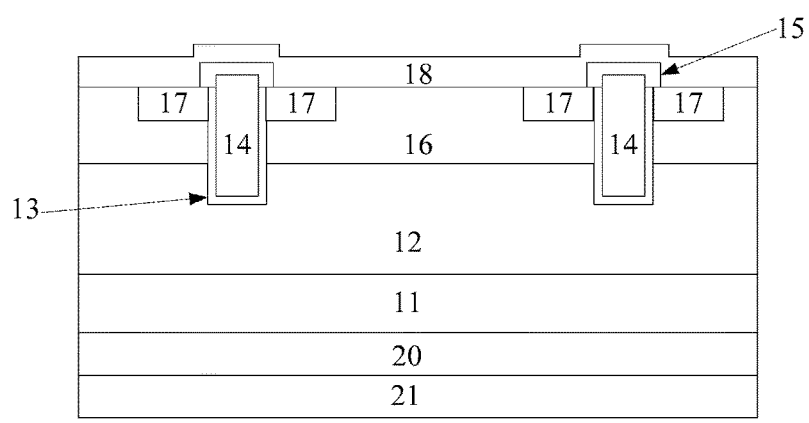

In step S16, a rear structure of the ITC-IGBT is formed on a rear surface of the highly doped substrate. The process of forming the rear structure of the ITC-IGBT on the rear surface of the highly doped substrate includes:

thinning the highly doped substrate by means of the chemical-mechanical polish process to form a collector region 20 having a thickness of 1 μm to 3 μm; and forming a collector 21 on a rear surface of the collector region 20, as shown in FIG. 12.

In the method for fabricating an ITC-IGBT disclosed in the embodiment, besides simplifying the fabrication process, since only one substrate is needed in the method for fabricating an ITC-IGBT according to the embodiment, the cost of raw material for preparing a chip is reduced, and the risk of wafer broken is reduced greatly since the thinning process is used only once in the fabrication process.

Third Embodiment

A method for fabricating an ITC-IGBT chip is disclosed according to the embodiment. The method includes the following steps S21 to S25.

In step S21, a heavily doped substrate is prepared, and the heavily doped substrate is heavily P-type doped, with a thickness ranging from 300 μm to 500 μm.

In step S22, a $Ge_xSi_{1-x}$/Si multiple quantum well strained superlattice layer is formed on a surface of the heavily doped substrate by means of the molecular beam epitaxy process.

Specifically, a $Ge_xSi_{1-x}$ layer with a thickness of 20 nm and a Si layer with a thickness of 80 nm grow alternately in 50 cycles to 100 cycles on the surface of the heavily doped substrate by means of the molecular beam epitaxy process, to form the $Ge_xSi_{1-x}$/Si multiple quantum well strained superlattice layer. The $Ge_xSi_{1-x}$/Si multiple quantum well strained superlattice layer has a thickness of 5 μm to 10 μm, preferably 8 μm. In the $Ge_xSi_{1-x}$/Si multiple quantum well strained superlattice layer, a deep energy level center E1 is located at Ec-0.28 eV, a deep energy level center E2 is located at Ec-0.3 eV and a deep energy level center E3 is located at Ec-0.22 eV. The $Ge_xSi_{1-x}$/Si multiple quantum well strained superlattice layer is N-type doped, with a doping concentration ranging from 1e 13 cm$^{-3}$ to 5e 13 cm$^{-3}$, preferably 2e 13 cm$^{-3}$ to 4e13cm$^{-3}$.

In step S23, the $Ge_xSi_{1-x}$/Si multiple quantum well strained superlattice layer is annealed by means of the high temperature annealing process. The annealing temperature for the high temperature annealing process ranges from 700 Celsius degrees to 800 Celsius degrees, preferably 750 Celsius degrees.

Since the $Ge_xSi_{1-x}$/Si multiple quantum well strained superlattice layer is a metastable structure, some dislocation defects are formed inevitably at the interfaces of $Ge_xSi_{1-x}$/Si. After being annealed, the dislocation defects in the $Ge_xSi_{1-x}$/Si multiple quantum well strained superlattice layer may form recombination centers at deep energy levels. That is, the $Ge_xSi_{1-x}$/Si multiple quantum well strained superlattice layer becomes a high recombination layer, and is formed on the surface of the heavily doped substrate by means of the molecular beam epitaxy process. Therefore, the $Ge_xSi_{1-x}$/Si multiple quantum well strained superlattice layer may be formed with a large thickness, and formed on the surface of the heavily doped substrate in one step, thereby simplifying the fabrication process of the ITC-IGBT compared with the conventional technology.

In step S24, a lightly doped layer is grown on a surface of the $Ge_xSi_{1-x}$/Si multiple quantum well strained superlattice layer by means of the epitaxy process, the lightly doped layer is preferably a lightly N-type doped crystalline silicon layer, and the thickness of the lightly doped layer may be determined according to the withstand voltage demands in device design and the capacity of an epitaxy apparatus, preferably, the lightly doped layer has a thickness of 50 μm to 100 μm, or more preferably, the lightly doped layer has a thickness of 70 μm to 80 μm.

After the lightly doped layer is formed, the method further includes step 25.

In step 25, a front structure of the ITC-IGBT chip is formed on the lightly doped layer. The process of forming the front structure of the ITC-IGBT chip on the lightly doped layer includes the following steps.

In step 251, an oxide layer is formed on the surface of the lightly doped layer. Specifically, the lightly doped layer is placed in a furnace pipe, high temperature hydrogen gas and oxygen gas in a specified proportion are introduced into the furnace pipe, and a silicon oxide layer is formed on the surface of the lightly doped layer by means of the wet oxidation process, and thus the oxide layer is fabricated.

In step 252, the oxide layer is etched to form a terminal region, and a guard ring structure is formed in the lightly doped layer. Specifically, photoresist is coated on the surface of the lightly doped layer to form a photoresist layer. The photoresist layer is exposed and developed by using a mask having a terminal region pattern. The terminal region pattern is formed on the photoresist layer, and then the oxide layer is etched by using the photoresist layer having the terminal region pattern as a mask, to form the terminal region. Doping ions in the guard ring structure are implanted into the lightly doped layer by using the photoresist layer having the terminal region pattern as a mask by means of the ion implantation process, with a doping concentration ranging from 1e$^{14}$ cm$^{-2}$ to 1e$^{16}$ cm$^{-2}$. A high temperature annealing treatment is performed on the lightly doped layer, with an annealing temperature ranging from 1000 Celsius degrees to 1200 Celsius degrees, to activate the doping ions in the guard ring structure, and the photoresist layer is removed. The guard ring structure is heavily P-type doped preferably and the doping ions in the guard ring structure are preferably Phosphorus ions. Since the guard ring structure may extend an electric field, the withstand voltage level of the chip may be increased.

In step 253, the remaining oxide layer is etched to form an emitter region. Specifically, photoresist is coated on the surface of the lightly doped layer and the surface of the oxide layer to form a photoresist layer. The photoresist layer is exposed and developed by using a mask having an active region pattern. The active region pattern is formed on the photoresist layer, then the oxide layer is etched by using the photoresist layer having the active region pattern as a mask, to form an active region, and the photoresist layer is removed. The active region is a region where the ITC-IGBT is distributed.

In step 254, a front structure of the ITC-IGBT is fabricated in the active region. The difference from the above fabrication process of the front structure of the ITC-IGBT is that, after the emitter region is formed and before an emitter is formed, the fabrication process according to the embodiment further includes:

forming an insulation protective layer on the surface of the lightly doped layer and the surface of the second gate dielectric layer. Specifically, the insulation protective layer is formed on the surface of the lightly doped layer and the surface of the second gate dielectric layer by means of the chemical vapor deposition process, the insulation protective layer is preferably a boro-phospho-silicate glass layer, and the insulation protective layer preferably has a thickness of 1.5 μm to 2 μm. The insulation protective layer may prevent contaminating ions on the surface of the chip from diffusing into the chip, thereby protecting the stability of the chip from the contaminating ions.

The insulation protective layer is etched to form contact holes. Specifically, the contact holes are formed on the insulation protective layer by means of the photoetching process and the etching process, to expose the trench gate and the emitter region, thereby facilitating to form the emitter and a gate after the front-side metallization is completed. It should be noted that, the emitter is electrically contacted with the emitter region, and the gate is electrically contacted with the trench gate; specifically, the portion of the insulation protective layer etched to form the contact hole exposing the trench gate needs to be over-etched when being etched, to etch the second gate dielectric layer below the contact hole, so that the gate is electrically contacted with the trench gate.

In the technical solutions according to the embodiment of the disclosure, the heavily doped substrate is prepared, the $Ge_xSi_{1-x}$/Si multiple quantum well strained superlattice layer is formed on the surface of the heavily doped substrate, and the lightly doped layer is formed on the surface of the $Ge_xSi_{1-x}$/Si multiple quantum well strained superlattice layer. The $Ge_xSi_{1-x}$/Si multiple quantum well strained superlattice layer is a metastable structure, and some dislocation defects are formed inevitably at the interfaces of $Ge_xSi_{1-x}$/Si. The dislocation defects and lattice mismatch may bring deep centers in a forbidden band and become effective carrier traps or recombination centers. That is, the $Ge_xSi_{1-x}$/Si multiple quantum well strained superlattice layer is a high recombination layer and is formed on the surface of the heavily doped substrate. Therefore, the $Ge_xSi_{1-x}$/Si multiple quantum well strained superlattice layer may be formed with a large thickness, and formed on the surface of the heavily doped substrate in one step, thereby simplifying the fabrication process of the ITC-IGBT compared with the conventional technology.

Fourth Embodiment

An ITC-IGBT is disclosed according to the embodiment, as shown in FIG. 12, which includes:

a collector region 20 highly P-type doped;

a $Ge_xSi_{1-x}$/Si multiple quantum well strained superlattice layer 11 located on a surface of the collector region 20; and a lightly doped layer 12 located on a surface of the $Ge_xSi_{1-x}$/Si multiple quantum well strained superlattice layer 11, where the lightly doped layer 12 is lightly N-type doped and the lightly doped layer 12 has a thickness of 50 μm to 100 μm.

The $Ge_xSi_{1-x}$/Si multiple quantum well strained superlattice layer 11 has a thickness of 5 μm to 10 μm, preferably 8 μm, and includes 50 cycles to 100 cycles of $Ge_xSi_{1-x}$/Si strained superlattice layers. In the $Ge_xSi_{1-x}$/Si multiple quantum well strained superlattice layer 11, a deep energy level center E1 is located at Ec-0.28 eV, a deep energy level center E2 is located at Ec-0.3 eV and a deep energy level center E3 is located at Ec-0.22 eV. The $Ge_xSi_{1-x}$/Si multiple quantum well strained superlattice layer 11 is N-type doped, with a doping concentration ranging from 1e 13 $cm^{-3}$ to 5e 13$cm^{-3}$.

Since the $Ge_xSi_{1-x}$/Si multiple quantum well strained superlattice layer 11 is a metastable structure, some dislocation defects are formed inevitably at the interfaces of $Ge_xSi_{1-x}$/Si. After being annealed, the dislocation defects in the $Ge_xSi_{1-x}$/Si multiple quantum well strained superlattice layer 11 may form recombination centers at deep energy level. That is, the $Ge_xSi_{1-x}$/Si multiple quantum well strained superlattice layer 11 becomes a high recombination layer.

Additionally, the $Ge_xSi_{1-x}$/Si multiple quantum well strained superlattice layer 11 has temperature stability, and the dislocation defects are not decreased or dismissed with long term operation of the $Ge_xSi_{1-x}$/Si multiple quantum well strained superlattice layer 11 at a high temperature. Therefore, the dislocation defects in the $Ge_xSi_{1-x}$/Si multiple quantum well strained superlattice layer 11 according to the embodiment has better temperature stability compared with the high recombination layer obtained by means of ion implantation process.

The ITC-IGBT further includes:

a front structure of the ITC-IGBT located on the lightly doped layer 12; and a collector 21 located on a rear surface of the collector region 20, where the collector region 20 and the collector 21 constitute the rear structure of the ITC-IGBT.

The front structure of the ITC-IGBT includes:

a trench located in a surface of the lightly doped layer, where the trench has a depth of 5 μm to 8 μm;

a first gate dielectric layer 13 located on a bottom and sidewalls of the trench, where the first gate dielectric layer 13 is preferably a silicon dioxide layer, and has a thickness of 800 nm to 1000 nm, preferably 900 nm;

a trench gate 14 located in the trench, where the trench gate 14 fills up the trench and the trench gate 14 is preferably a polysilicon gate;

a second gate dielectric layer 15 wrapping a surface of the trench gate 14, where the second gate dielectric layer 15 is preferably a silicon dioxide layer;

a well region 16 located in the surface of the lightly doped layer 12, where a surface of the well region 16 is flush with the surface of the lightly doped layer 12, the well region 16 is doped with P-type doping ions, preferably Boron ions;

an emitter region 17 located in the well region 16, where a surface of the emitter region 17 is flush with the surface of the lightly doped layer 12, the emitter region 17 is heavily doped with N-type doping ions, preferably Arsenic ions or Phosphorus ions; and an emitter 18 located on the surface of the well region 16 and the surface of the emitter region 17, where the emitter 18 is electrically contacted with the well region 16 and the emitter region 17.

Additionally, the front structure of the ITC-IGBT further includes a gate (not shown in FIG. 12), and the gate is electrically contacted with the trench gate 14.

In the embodiments of the disclosure, an ITC-IGBT and a method for fabricating the same are taken as an example, and the structure and fabrication method for the ITC-IGBT are illustrated. If the ITC-IGBT has a P-type emitter region or has a planar gate, there may be a slight difference in the fabrication steps and process, but as long as consistent with the subject idea of the embodiments of the disclosure, the difference falls into the scope of the embodiments of the disclosure.

Additionally, the drawings in the specification are schematic, and do not represent a real scale. All numerical ranges in the specification are inclusive of their end points. The embodiments of the present disclosure are described in a progressive manner, each embodiment places emphasis on the difference from other embodiments, therefore, one embodiment can refer to other embodiments for the same or similar parts.

The invention claimed is:

1. A method for fabricating an Internally Transparent Collector-Insulated Gate Bipolar Transistor (ITC-IGBT), comprising:
   preparing a doped substrate;
   forming a $Ge_xSi_{1-x}/Si$ multiple quantum well strained superlattice layer on a surface of the doped substrate by means of the molecular beam epitaxy process; and
   forming a doped layer on a surface of the $Ge_xSi_{1-x}/Si$ multiple quantum well strained superlattice layer, wherein the $Ge_xSi_{1-x}/Si$ multiple quantum well strained superlattice layer is N-type doped, with a doping concentration ranging from $1e13$ $cm^{-3}$ to $5e13$ $cm^{-3}$.

2. The method according to claim 1, wherein after the process of forming a $Ge_xSi_{1-x}/Si$ multiple quantum well strained superlattice layer, the method further comprises:
   annealing the $Ge_xSi_{1-x}/Si$ multiple quantum well strained superlattice layer by means of a temperature annealing process.

3. The method according to claim 2, wherein the annealing temperature for the high temperature annealing process ranges from 700 Celsius degrees to 800 Celsius degrees.

4. The method according to claim 1, wherein the $Ge_xSi_{1-x}/Si$ multiple quantum well strained superlattice layer has a thickness of 5 μm to 10 μm.

5. The method according to claim 1, wherein the $Ge_xSi_{1-x}/Si$ multiple quantum well strained superlattice layer comprises 50 cycles to 100 cycles of $Ge_xSi_{1-x}/Si$ strained superlattice layers.

6. The method according to claim 1, wherein after the process of forming a doped layer, the method further comprises:
   forming a front structure of the ITC-IGBT on the doped layer; and
   forming a rear structure of the ITC-IGBT on a rear surface of the highly doped substrate.

7. The method according to claim 6, wherein the process of forming a front structure of the ITC-IGBT on the doped layer comprises:
   forming a trench in a surface of the doped layer by means of the laser etching process;
   forming a first gate dielectric layer on a bottom and sidewalls of the trench;
   forming a trench gate in the trench, wherein the trench gate fills up the trench;
   forming a second gate dielectric layer on a surface of the trench gate;
   forming a well region in the surface of the doped layer by means of the ion implantation process and the high temperature annealing process, wherein a surface of the well region is flush with the surface of the doped layer;
   forming an emitter region in the well region by means of the ion implantation process and the high temperature annealing process, wherein a surface of the emitter region is flush with the surface of the doped layer; and
   forming an emitter on the surface of the well region and the surface of the emitter region and forming a gate on the surface of the trench gate by etching the second gate dielectric layer.

8. The method according to claim 6, wherein the process of forming a rear structure of the ITC-IGBT on a rear surface of the highly doped substrate comprises:
   thinning the highly doped substrate by means of the chemical-mechanical polish process to form a collector region;
   forming a collector on a rear surface of the collector region.

9. The method according to claim 7, wherein the highly doped substrate is highly P-type doped, the doped layer is N-type doped, the well region is P-type doped and the emitter region is highly N-type doped.

10. An Internally Transparent Collector-Insulated Gate Bipolar Transistor (ITC-IGBT), comprising:
    a collector region;
    a $Ge_xSi_{1-x}/Si$ multiple quantum well strained superlattice layer located on a surface of the collector region; and
    a doped layer located on a surface of the $Ge_xSi_{1-x}/Si$ multiple quantum well strained superlattice layer, wherein the $Ge_xSi_{1-x}/Si$ multiple quantum well strained superlattice layer is N-type doped, with a doping concentration ranging from $1e13$ $cm^{-3}$ to $5e13$ $cm^{-3}$.

11. The ITC-IGBT according to claim 10, wherein the $Ge_xSi_{1-x}/Si$ multiple quantum well strained superlattice layer has a thickness of 5 μm to 10 μm.

12. The ITC-IGBT according to claim 10, wherein the $Ge_xSi_{1-x}/Si$ multiple quantum well strained superlattice layer comprises 50 cycles to 100 cycles of $Ge_xSi_{1-x}/Si$ strained superlattice layers.

13. The ITC-IGBT according to claim 10, further comprising:
    a front structure of the ITC-IGBT located on the doped layer; and
    a collector located on a rear surface of the collector region.

14. The ITC-IGBT according to claim 13, wherein the front structure of the ITC-IGBT comprises:
    a trench located in a surface of the doped layer;
    a first gate dielectric layer located on a bottom and sidewalls of the trench;
    a trench gate located in the trench, wherein the trench gate fills up the trench;
    a second gate dielectric layer wrapping a surface of the trench gate;
    a well region located in the surface of the doped layer, wherein a surface of the well region is flush with the surface of the doped layer;
    an emitter region located in the well region, wherein a surface of the emitter region is flush with the surface of the doped layer; and
    an emitter located on the surface of the well region and the surface of the emitter region and a gate located on the surface of the trench gate.

15. The ITC-IGBT according to claim 14, wherein the collector region is highly P-type doped, the doped layer is N-type doped, the well region is P-type doped and the emitter region is highly N-type doped.

* * * * *